(12) United States Patent
Vahidfar et al.

(10) Patent No.: US 8,265,580 B2
(45) Date of Patent: Sep. 11, 2012

(54) SYSTEM AND METHOD FOR HANDLING STRONG SIGNALS AND BLOCKERS IN THE RF FRONT END

(75) Inventors: Mohammad Bagher Vahidfar, San Jose, CA (US); Vahid Mesgarpour Toosi, Mountain View, CA (US); Saeid Mehrmanesh, San Jose, CA (US)

(73) Assignee: SiTune Coporation, San Jose, CA (US)

( * ) Notice: Subject to any disclaimer, the term of this patent is extended or adjusted under 35 U.S.C. 154(b) by 386 days.

(21) Appl. No.: 12/620,528

(22) Filed: Nov. 17, 2009

(65) Prior Publication Data

US 2011/0117868 A1    May 19, 2011

(51) Int. Cl.
*H04B 17/00* (2006.01)
*H04B 1/06* (2006.01)
*H04B 7/00* (2006.01)

(52) U.S. Cl. ............ 455/226.1; 455/226.2; 455/232.1; 455/253.2

(58) Field of Classification Search .... 455/226.1–226.4, 455/232.1, 239, 248.1–250.1, 287, 234.1–235.1, 455/239.1–243.1, 245.1–253.2
See application file for complete search history.

(56) References Cited

U.S. PATENT DOCUMENTS

| | | | | |
|---|---|---|---|---|
| 5,689,814 A * | 11/1997 | Hagisawa et al. | ............... | 455/69 |
| 6,298,221 B1 * | 10/2001 | Nguyen | .......................... | 455/73 |
| 6,498,926 B1 * | 12/2002 | Ciccarelli et al. | .......... | 455/240.1 |
| 6,687,491 B2 * | 2/2004 | Wieck | ........................ | 455/234.1 |
| 6,826,418 B2 * | 11/2004 | Adachi et al. | ................. | 455/574 |
| 7,292,830 B1 * | 11/2007 | Cheung et al. | ................ | 455/136 |
| 7,795,979 B2 * | 9/2010 | Ishiguro | ....................... | 330/284 |
| 7,982,539 B2 * | 7/2011 | Shen et al. | ..................... | 330/279 |
| 8,060,041 B2 * | 11/2011 | Ballantyne | .................... | 455/133 |
| 2008/0003967 A1 * | 1/2008 | Kuroda | ....................... | 455/232.1 |
| 2011/0086603 A1 * | 4/2011 | Toosi et al. | ................ | 455/192.1 |

\* cited by examiner

*Primary Examiner* — Simon Nguyen
(74) *Attorney, Agent, or Firm* — Novak Druce + Quigg LLP (57) ABSTRACT

An incoming RF signal can be amplified in a RF front end of a RF receiver by conveying the signal through one of a multiple amplification paths. On each path, the gain can be controlled by RF automatic gain control (AGC) circuits. Each amplification path can be designed to handle incoming signals in a designated power range and to optimize receiver performance characteristics such as the noise figure (NF) and odd harmonic linearity in that power range. Signal power can be measured at different locations of the receiver and bypass switches can be used to convey the RF signals down one of the multiple paths based on the power measurements, according to executable logical code. An incoming signal power hysteresis can be applied to stabilize the system. Further, signal power averaging and switch delaying mechanisms can be employed to stabilize the system for rapidly fluctuating signals.

16 Claims, 5 Drawing Sheets

SYSTEM AND METHOD FOR HANDLING STRONG SIGNALS AND BLOCKERS IN THE RF FRONT END

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

This invention relates generally to the field of radio frequency receivers, and more specifically to tuner front end circuits.

BACKGROUND

As communications devices such as cell phones, PDAs, mobile televisions, personal navigation devices, personal media players and a myriad others continue to become more commonplace in the modern society, the performance requirements of communications systems are increasing at a staggering pace. Today, these devices are expected to perform with increasing reliability and improved capabilities while maintaining a competitive price point. The receiver is a determining component in a communications device's performance and cost. The receiver's function is to receive an often significantly distorted and attenuated signal and convert it into a signal that can be used by the other components in the system. The quality of the signals produced by the receiver is a limiting factor in the performance of communications systems and manufacturers continuously strive to improve this aspect of receiver design.

Generally, a communications system includes a transmitter communicating with a receiver over a communications channel. The transmitter sends a signal over the communications channel to a receiver located in a device. The communications channel can be cable wire, air, or other medium. The receiver can receive the signal from an antenna or through direct wire transmission. Generally, before information contained in the signal is used in the device, the signal's power is increased through amplification. Hence, the portion of the receiver where amplification takes place is typically referred to as the RF front end. Usually, the RF front end is a circuit incorporating one or more low noise amplifiers (LNAs). The gain in the RF front end can be controlled by RF automatic gain control (AGC) circuits.

Further, the power of signals received at a receiver can vary significantly. Namely, due to attenuation, a signal's power declines as the signal travels away from the transmitter. For example, a signal sent to a receiver through the air may have significantly lower power further from the transmitter than close to it. The difference in power can be in the order of several magnitudes. Hence, a device in a traveling vehicle, for instance, may observe severe fluctuation in incoming signal power as it travels from the proximity of one radio tower into the proximity of another radio tower. As a result, the receiver must be able to amplify incoming signals in a broad range of powers to produce signals with desired power and other desirable characteristics.

Existing devices apply a single amplification routine to all incoming signals. However, this results in a non-optimal routine being applied to signals in much of the power range. Especially in the case of strong signals and blockers (undesired received signals), a RF front end designed for low power signals and optimized for low noise figure and input matching will produce intolerable nonlinearity and distortion. What is needed is a mechanism for amplifying incoming signals in a broad range of powers that produces signals with desired power, linearity, noise figure, and other desirable characteristics across the range.

DETAILED DESCRIPTION

In the following description, numerous specific details are set forth in order to provide a thorough understanding of the present invention. However, it will be apparent to one skilled in the art that the present invention can be practiced without these specific details. In other instances, well known circuits, components, algorithms, and processes have not been shown in detail or have been illustrated in schematic or block diagram form in order not to obscure the present invention in unnecessary detail. Additionally, for the most part, details concerning communications systems, transmitters, receivers, communications devices and the like, have been omitted inasmuch as such details are not considered necessary to obtain a complete understanding of the present invention and are considered to be within the understanding of persons of ordinary skill in the relevant art. It is further noted that, where feasible, all functions described herein may be performed in either hardware, software, firmware, analog components or a combination thereof, unless indicated otherwise. Certain terms are used throughout the following description and claims to refer to particular system components. As one skilled in the art will appreciate, components may be referred to by different names. This document does not intend to distinguish between components that differ in name, but not function. In the following discussion and in the claims, the terms "including" and "comprising" are used in an open-ended fashion, and thus should be interpreted to mean "including, but not limited to . . . ."

Embodiments of the present invention are described herein. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with applications and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

In various embodiments, systems and methods are described for handling signals in a RF front end. In various embodiments, a RF signal can be received in a receiver. For example, the RF signal can be a broadband TV signal in UHF and VHF frequencies. Before the signal is conveyed to other portions of the receiver, the signal can be processed and/or amplified in a portion of the receiver commonly known as the RF front end.

Figure 1:
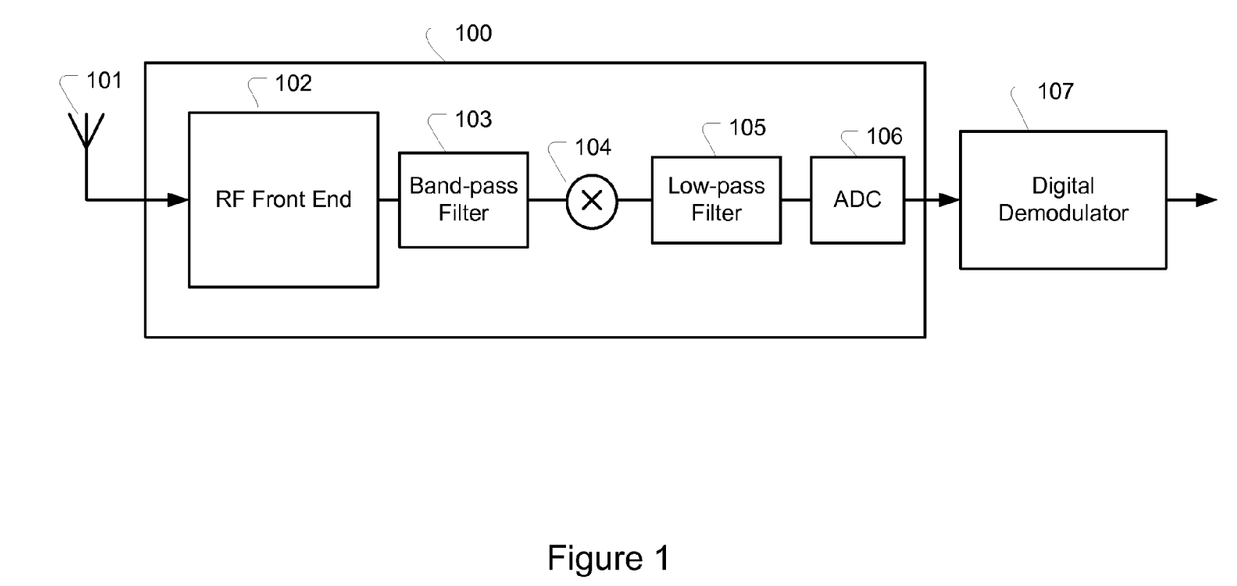
FIG. 1 illustrates a receiver in accordance with various embodiments of the invention.

FIG. 1 illustrates a receiver in accordance with various embodiments of the invention. As illustrated in FIG. 1, a RF signal can be received in the receiver 100 through an antenna 101. The signal can be conveyed to a portion of the receiver termed the RF front end 102, where the signal can be amplified and processed according to various embodiments of the invention. The signal can then be conveyed to a band-pass filter 103, a mixer 104, a low-pass filter 105, an analog to digital converter 106, and finally to a digital demodulator 107.

The power of the signals received at the RF front end can vary significantly. For example, the power of RF TV signals in the ATSC standard can range from less than −80 dBm to over 6 dBm. Applying a single amplification routine to signals across this power range can lead to problems such as under-amplification of weak signals and over-amplification of strong signals. Additionally, noise can be a problem when amplifying small signals and signal distortion can be a problem when amplifying large signals. Optimizing an amplification routine for both noise and distortion poses significant challenges. Especially in the case of strong signals and blockers (undesired received signals), a RF front end designed for low power signals and optimized for low noise figure and input matching will produce intolerable nonlinearity and distortion. Hence, to optimize signal characteristics such as noise figure, linearity, and input matching, it is advantageous to apply different amplification routines to signals of different power. Further, a system that applies multiple amplification routines may need to incorporate stability mechanisms; for example, to prevent constant switching between amplification routines that might unfavorably affect performance of the device when a signal is in a power range that falls between the specified power ranges of two routines. Also, a system may need to incorporate stability mechanisms to prevent constant switching between amplification routines that might unfavorably affect performance when a signal displays rapid fluctuations in power.

In various embodiments of the invention, a RF front end can incorporate multiple parallel paths on which an incoming signal can be processed and amplified. Each path can contain a different configuration of components to vary the processing and the amount of amplification on the path. For instance, a path that is configured for stronger amplification may have a larger number of and/or stronger low noise amplifiers (LNAs) than a path that is configured for weaker amplification. A path can contain an RF automatic gain control (AGC) circuit. One or more bypass switches in the system can be used to direct incoming signals down one of the multiple paths in the system. In various embodiments, a bypass switch can be closed to convey subsequent signals down the path containing the bypass switch while all alternative paths are disabled. In various embodiments, a path can be disabled by opening a bypass switch on the path. In various embodiments, a path can be disabled by disabling components on the path. In the accompanying figures, various embodiments of the invention are illustrated containing bypass switches. It is to be understood that bypass switches in the figures are included for purposes of illustrating function and that closing of a bypass switch will activate the path on which the bypass switch is located and disable all other paths although any specific path-disabling components may not be illustrated. A digital received signal strength indicator (RSSI) unit can control on which path amplification is performed by controlling the switches. The digital RSSI can determine on which path to perform amplification by analyzing various data, which data can include the outputs of one or more power detectors. Such power detectors can measure the power of the received signal at one or more locations on the signal's path. In various embodiments, it can be advantageous to use multiple power detectors. For example, a given power detector may be capable of measuring signals in a limited range of power and employing multiple power detectors to produce measurements across a broad power range might be desirable.

Figure 2:
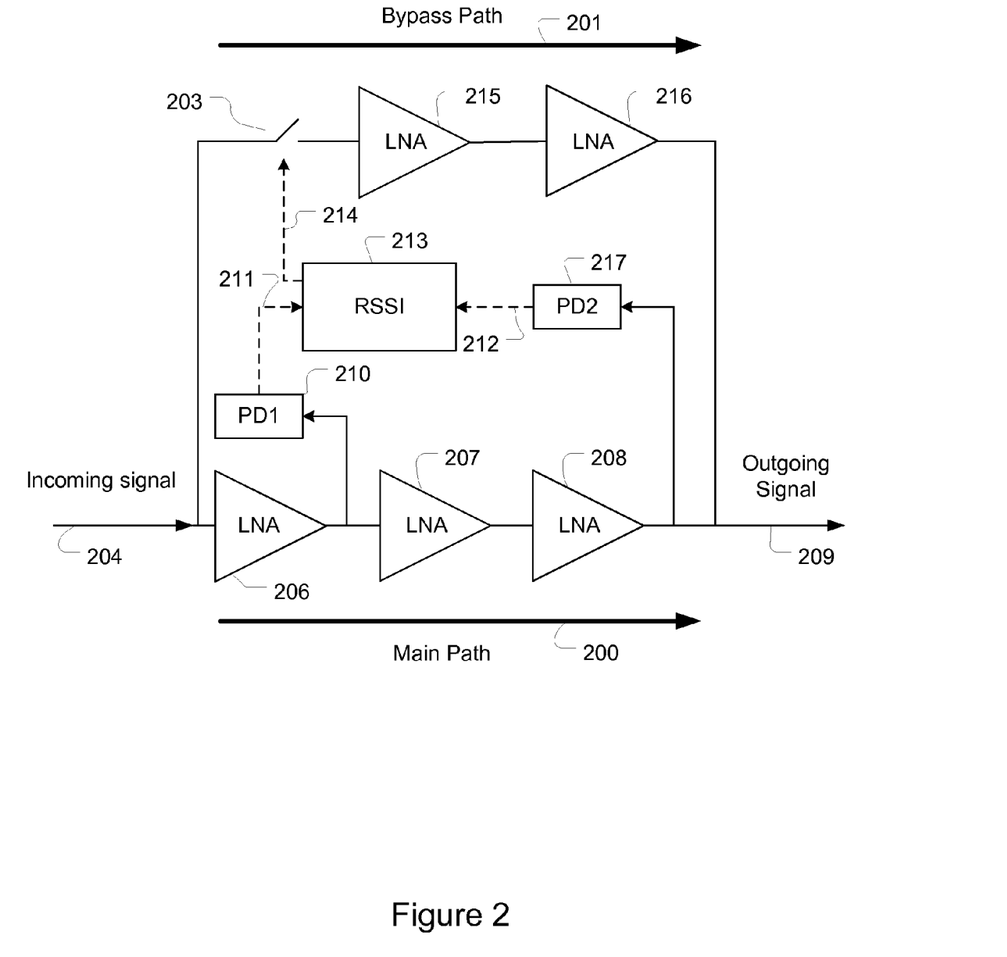
FIG. 2 illustrates a RF front end with a main path with more amplification for low power signals and a bypass path with less amplification for high power signals, in accordance with various embodiments of the invention.

FIG. 2 illustrates a RF front end with a main path with more amplification for low power signals and a bypass path with less amplification for high power signals, in accordance with various embodiments of the invention. In various embodiments, in an initial state, a bypass switch 203 can be in an open position and an incoming signal 204 can be conveyed down the main path 200 through a first 206, a second 207, and a third 208 low noise amplifier (LNA) to produce an amplified outgoing signal 209. After passing through the first low noise amplifier 206, the signal can be conveyed to a first power detector (PD1) 210 where the signal power can be measured and a corresponding power value signal 211 can be generated. The power value signal 211 can be conveyed to a digital RSSI 213 for analysis. Based on received power value signals 211, the RSSI 213 can determine that amplification should be performed on the bypass path 201. In that case, the RSSI 213 can send a signal 214 to the bypass switch 203 to close the switch, thereby sending subsequent incoming signals down the bypass path 201. On the bypass path 201, the incoming signal 204 can be conveyed to a first 215 and a second 216 low noise amplifier to produce an outgoing signal 209. The outgoing signal 209 can be conveyed to a second power detector (PD2) 217 where the signal power can be measured and a corresponding power value signal 212 can be generated. The power value signal 212 can then be conveyed to the digital RSSI 213 for analysis. Based on the power value signal 212, the RSSI 213 can determine that amplification should be performed on the main path 200. In that case, the RSSI 213 can send a signal 214 to the bypass switch 203 to open the switch, thereby sending subsequent incoming signals 204 down the main path 200. Accordingly, a power value signal 211 can again be generated in the first power detector 210 and the process can repeat.

In various embodiments, logic incorporated into the digital RSSI 213 can control the opening and closing of the bypass switch 203, and hence on which path amplification is performed. With the switch 203 in the open position and amplification being performed on the main path 200, the RSSI 213 can receive power value signals 211 from the first power detector 210. In various embodiments, the RSSI 213 can detect when the power value signal 211 is larger than a predetermined threshold T1. If the power value signal 211 is consistently larger than the threshold value T1 for a predefined period of time or for a predefined number of consecutive measurements performed by the power detector 210, then the RSSI 213 can send a signal 214 to close the switch 203, conveying the signal down the bypass path 201 with less amplification. In various embodiments, if the power value signal 211 is measured to be lower than T1 for fewer than a predetermined number of measurements and larger than T1 for a different predetermined number of measurements, then the RSSI 213 can send a signal 214 to close the switch 203. In various embodiments, if the average value of the power value signals 211 taken over a predetermined number of measurements is larger than the threshold value T1, then the RSSI 213 can send a signal 214 to close the switch 203. In various embodiments, the RSSI 213 can contain two registers, an N register and an M register. The RSSI 213 can keep a count of the number of times that the power value signal 211 is higher than the threshold value T1 in the N register. If the value of N reaches a predetermined value N0, then the RSSI can send a signal to close the switch 203 and the counts in both registers can be reset to 0. Further, in the M register, the RSSI 213 can keep a count of the number of times that the power value signal 211 is lower than the threshold value T1. When the value of M reaches a predetermined value L, the value of both N and M can be reset to 0, thereby avoiding switching to the bypass path when the power value signal 211 is not consistently higher than the threshold value T1.

With the switch 203 in the closed position and amplification being performed on the bypass path 201, the RSSI 213 can receive power value signals 212 from the second power detector 217. In various embodiments, the RSSI 213 can detect when the power value signal 212 is lower than a predetermined threshold T2. If the power value signal 212 is consistently lower than the threshold value T2 for a predefined period of time or for a predefined number of consecutive measurements performed by the power detector 217, then the RSSI 213 can send a signal 214 to open the switch 203, conveying the signal down the main path 200 with more amplification. In various embodiments, if the power value signal 211 is measured to be higher than T2 for fewer than a predetermined number of measurements and lower than T2 for a different predetermined number of measurements, then the RSSI 213 can send a signal 214 to open the switch 203. In various embodiments, if the average value of the power value signals 212 taken over a predetermined number of measurements is lower than the threshold value T2, then the RSSI 213 can send a signal 214 to open the switch 203. In various embodiments, the RSSI 213 can keep a count of the number of times that the power value signal 212 is lower than the threshold value T2 in the N register. If the value of N reaches a predetermined value N0, then the RSSI 213 can send a signal to open the switch and the counts in both registers can be reset to 0. Further, in the M register, the RSSI 213 can keep a count of the number of times that the power value signal 212 is higher than the threshold value T2. When the value of M reaches a predetermined value L, the value of both N and M can be reset to 0, thereby avoiding switching to the main path 200 when the power value signal 212 is not consistently lower than the threshold value T2.

In various embodiments, the thresholds T1 and T2 can be set so that the switch is closed for incoming signals that are higher in power than the incoming signals for which the switch is opened, thereby creating an incoming signal power hysteresis that can stabilize the system. Namely, if the RSSI is configured to close the switch when incoming signals are at or above a power value P1, according to a switch closing logic as described above, then the RSSI can be configured to send a signal to open the switch when the incoming signals are below a power value that is less than P1 by a defined amount. An advantage of the embodiment is that a signal fluctuating in a power range around P1 will not create instability in the system by causing the system to constantly switch between amplification paths.

For example, in an embodiment, the value of T1 can be in the range of −15 dBm to −5 dBm, for instance, −10 dBm. In an embodiment, T2 can be in the range of −35 dBm to −25 dBm, for example, −30 dBm. In an embodiment, N could be a 15 bit register. The value N0 could be a number held in the N register. In an embodiment, M could be a 15 bit register. The value L could be a number held in the M register. In an embodiment, the value L could be determined by applying the identity $L=N0/2^T$ where T is a number held in a three bit register. In an embodiment, T can be selected at the design stage of a device. In another embodiment, a device can incorporate logic and circuitry that can adjust the value of T during operation according to the performance needs of the device.

Figure 3:
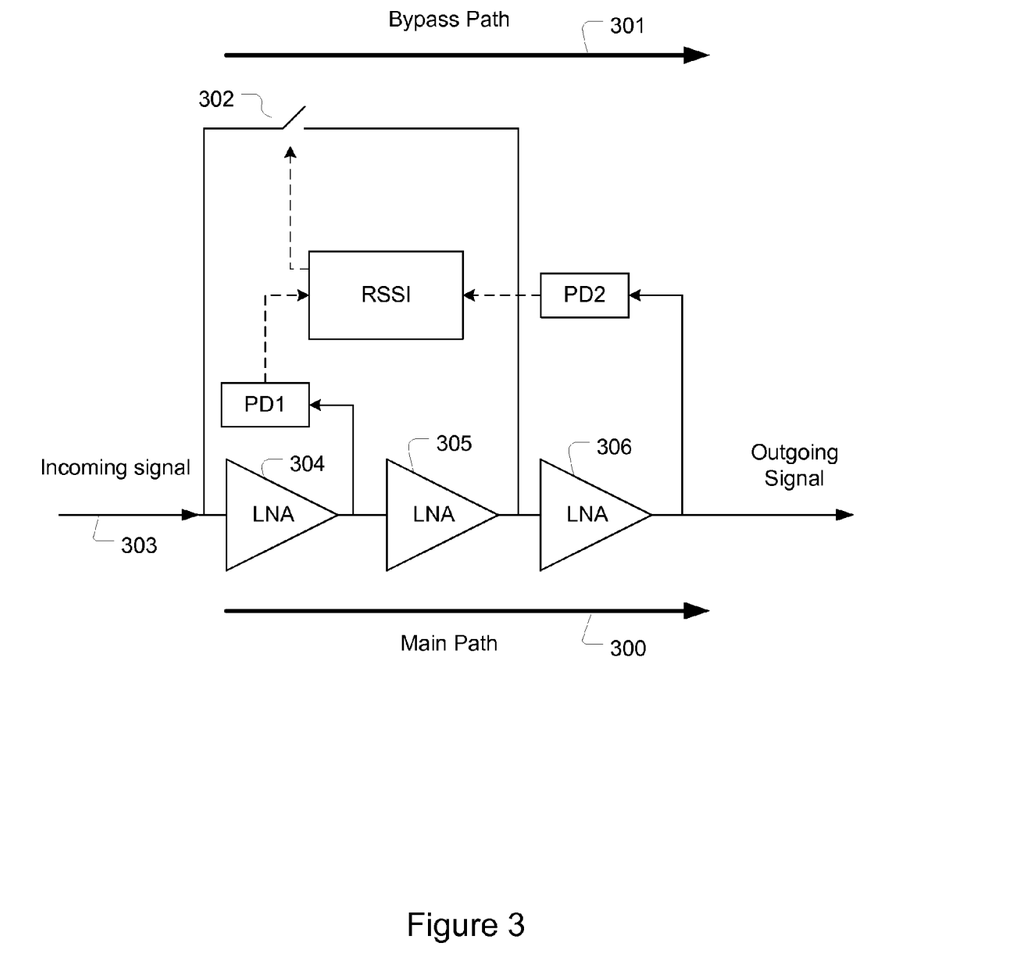
FIG. 3 illustrates a RF front end with a main path for low power signals and a bypass path for high power signals, where the bypass path conveys a signal through a portion of the main path, in accordance with various embodiments of the invention.

FIG. 3 illustrates a RF front end with a main path for low power signals and a bypass path for high power signals, where the bypass path conveys a signal through a portion of the main path, in accordance with various embodiments of the invention. As FIG. 3 illustrates, in various embodiments, the bypass path 301 can comprise a subset of the components of the main path 300. Hence, with the bypass switch 302 in the open position, an incoming signal 303 can be conveyed to a first 304, a second 305, and a third 306 LNA. With the bypass switch 302 in the closed position, the incoming signal 303 can be conveyed to the third 306 LNA and not the first 304 and not the second 305 LNA.

Figure 4:
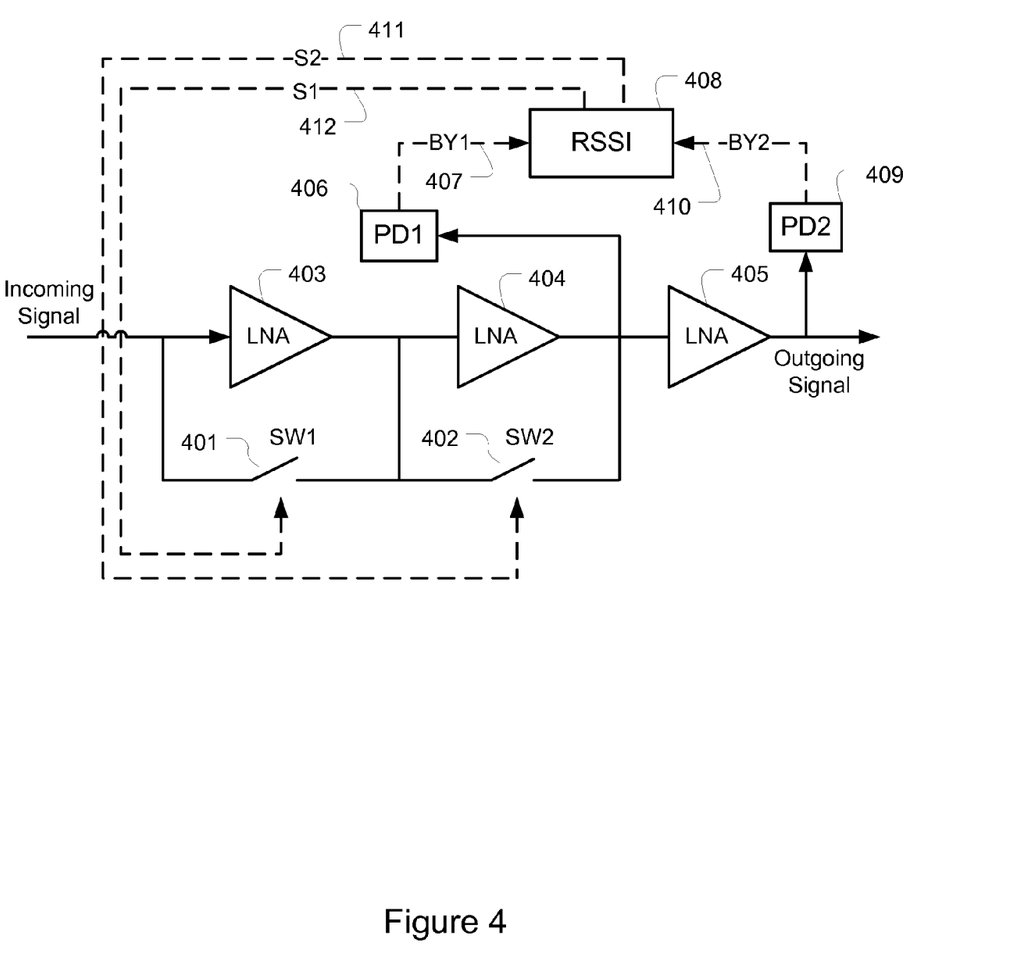
FIG. 4 illustrates a RF front end with two bypass switches, in accordance with various embodiments of the invention.

FIG. 4 illustrates a RF front end with two bypass switches, in accordance with various embodiments of the invention. Such a configuration can permit switching between three amplification routines in a RF front end. In various embodiments, in an initial state, a first 401 and a second 402 bypass switch can be in an open position and an incoming signal can be conveyed through a first 403, a second 404, and a third 405 LNA to produce an amplified outgoing signal. After passing through the first LNA 403 and second LNA 404, the signal can be conveyed to a first power detector (PD1) 406 where the signal power can be measured and a corresponding power value signal (BY1) 407 can be generated. The power value signal 407 can then be conveyed to a digital RSSI 408 for analysis. Based on the received power value signals 407, the RSSI 408 can determine to close the first switch 401 and bypass the first LNA 403. In that case, the RSSI 408 can send a signal (S1) 412 to the first bypass switch (SW1) 401 to close the switch, bypassing the first LNA 403 and performing amplification of subsequent incoming signals in the second 404 and third 405 LNA but not the first 403 LNA.

With the first switch 401 in the closed position and the second switch 402 in the open position, the signal can be conveyed to the first power detector 406 where the signal power can be measured and a corresponding power value signal 407 can be generated. The power value signal 407 can then be conveyed to a digital RSSI 408 for analysis. Based on received power value signals 407, the RSSI 408 can determine to bypass the second LNA 404. In that case, the RSSI 408 can send a signal (S2) 411 to the second bypass switch (SW2) 402 to close the switch, bypassing the second LNA 404 and performing amplification of subsequent incoming signals in the third 405 LNA but not the first 403 and not the second LNA 404.

With the first switch 401 in the closed position and the second switch 402 in the open position, the outgoing signal can be conveyed to a second power detector (PD2) 409 where the signal power can be measured and a corresponding power value signal (BY2) 410 can be generated. The power value signal 410 can then be conveyed to a digital RSSI 408 for analysis. Based on received power value signals 410, the RSSI 408 can determine to stop bypassing the first LNA 403. In that case, the RSSI 408 can send a signal to the first bypass switch 401 to open the switch, stopping bypassing of the first LNA 403 and performing amplification of subsequent incoming signals in the first 403, second 404, and third 405 LNA.

With the first switch 401 and the second switch 402 in the closed position, the outgoing signal can be conveyed to the second power detector 409 where the signal power can be measured and a corresponding power value signal 410 can be generated. The power value signal 410 can then be conveyed to a digital RSSI 408 for analysis. Based on received power value signals 410, the RSSI 408 can determine to stop bypassing the second LNA 404. In that case, the RSSI 408 can send a signal to the second bypass switch 402 to open the switch, stopping bypassing of the second LNA 404 and performing amplification of subsequent incoming signals in the second 404 and third 405 LNA but not the first 403 LNA.

In various embodiments, logic incorporated into the digital RSSI 408 can control the opening and closing of the first 401 and second 402 bypass switch, and hence on which path amplification is performed. With the first 401 and second 402 bypass switch in the open position and amplification being performed on the first 403, second 404, and third 405 LNA, the RSSI 408 can receive power value signals 407 from the first power detector 406. In various embodiments, the RSSI 408 can detect when the power value signal 407 is larger than a predetermined threshold T1. If the power value signal 407 is consistently larger than the threshold value T1 for a predefined period of time or for a predefined number of consecutive measurements performed by the power detector 406, then the RSSI 408 can send a signal 412 to close the first switch 401, bypassing the first LNA 403 and conveying subsequent signals to the second 404 and third 405 LNA but not the first 403 LNA. In various embodiments, if the power value signal 407 is measured to be lower than T1 for fewer than a predetermined number of measurements and larger than T1 for a different predetermined number of measurements, then the RSSI 408 can send a signal 412 to close the switch 401. In various embodiments, if the average value of the power value signals 407 taken over a predetermined number of measurements is larger than the threshold value T1, then the RSSI 408 can send a signal 412 to close the switch 401. In various embodiments, the RSSI 408 can contain two registers, an N register and an M register. The RSSI 408 can keep a count of the number of times that the power value signal 407 is higher than the threshold value T1 in the N register. If the value of N reaches a predetermined value N0, then the RSSI 408 can send a signal to close the switch and the counts in both registers can be reset to 0. Further, in the M register, the RSSI 408 can keep a count of the number of times that the power value signal 410 is lower than the threshold value T1. When the value of M reaches a predetermined value L, the value of both N and M can be reset to 0, thereby avoiding closing the switch 401 when the power value signal 407 is not consistently higher than the threshold value T1.

With the first switch 401 in the closed position and the second switch 402 in the open position and amplification being performed on the second 404 and third 405 LNA but not the first 403 LNA, the RSSI 408 can receive power value signals 410 from the second power detector 409. In various embodiments, the RSSI 408 can detect when the power value signal 410 is lower than a predetermined threshold T2. If the power value signal 410 is consistently lower than the threshold value T2 for a predefined period of time or for a predefined number of consecutive measurements performed by the power detector 409, then the RSSI 408 can send a signal 412 to open the first switch 401, conveying subsequent signals to the first 403, second 404, and third 405 LNA. In various embodiments, if the power value signal 410 is measured to be higher than T2 for fewer than a predetermined number of measurements and lower than T2 for a different predetermined number of measurements, then the RSSI 408 can send a signal 412 to open the switch 401. In various embodiments, if the average value of the power value signals 410 taken over a predetermined number of measurements is lower than the threshold value T2, then the RSSI 408 can send a signal 412 to open the switch 401. In various embodiments, the RSSI 408 can keep a count of the number of times that the power value signal 410 is lower than the threshold value T2 in the N register. If the value of N reaches a predetermined value N0, then the RSSI 408 can send a signal to open the first switch 401 and the counts in both registers can be reset to 0. Further, in the M register, the RSSI 408 can keep a count of the number of times that the power value signal 410 is higher than the threshold value T2. When the value of M reaches a predetermined value L, the value of both N and M can be reset to 0, thereby avoiding opening the switch 401 when the power value signal 410 is not consistently lower than the threshold value T2.

In various embodiments, the thresholds T1 and T2 can be set so that the switch 401 is closed for incoming signals that are higher in power than the incoming signals for which the switch is opened, thereby creating an incoming signal power hysteresis that can stabilize the system. Namely, if the RSSI 408 is configured to close the switch when incoming signals are at or above a power value P1, according to a switch closing logic as described above, then the RSSI 408 can be configured to send a signal to open the switch 401 when the incoming signals are below a power value that is less than P1 by a defined amount. An advantage of the embodiment is that a signal fluctuating in a power range around P1 will not create instability in the system by causing the system to constantly switch between amplification paths.

For example, in an embodiment, the value of T1 can be in the range of −15 dBm to −5 dBm, for instance, −10 dBm. In an embodiment, T2 can be in the range of −35 dBm to −25 dBm, for example, −30 dBm. In an embodiment, N could be a 15 bit register. The value N0 could be a number held in the N register. In an embodiment, M could be a 15 bit register. The value L could be a number held in the M register. In an embodiment, the value L could be determined by applying the identity $L=N0/2^T$ where T is a number held in a three bit register. In an embodiment, T can be selected at the design stage of a device. In another embodiment, a device can incorporate logic and circuitry that can adjust the value of T during operation according to the performance needs of the device.

With the first switch 401 in the closed position and the second 402 switch in the open position and amplification being performed on the second 404 and third 405 but not the first 403 LNA, the RSSI 408 can receive power value signals 407 from the first power detector 406. In various embodiments, the RSSI 408 can detect when the power value signal 407 is larger than a predetermined threshold value T3. In one embodiment, T3 can be the same value as T1; in another embodiment T3 and T1 can be different. If the power value signal 407 is consistently larger than the threshold value T3 for a predefined period of time or for a predefined number of consecutive measurements performed by the power detector 406, then the RSSI 408 can send a signal 411 to close the second switch 402, bypassing the second LNA 404 and conveying subsequent signals to the third 405 LNA but not the first 403 and not the second 404 LNA. In various embodiments, if the power value signal 407 is measured to be lower than T3 for fewer than a predetermined number of measurements and larger than T3 for a different predetermined number of measurements, then the RSSI 408 can send a signal 411 to close the switch 402. In various embodiments, if the average value of the power value signals 407 taken over a predetermined number of measurements is larger than the threshold value T3, then the RSSI 408 can send a signal 411 to close the switch 402. In various embodiments, the RSSI 408 can contain two registers, an N register and an M register. The RSSI 408 can keep a count of the number of times that the power value signal 407 is higher than the threshold value T3 in the N register. If the value of N reaches a predetermined value N0, then the RSSI 408 can send a signal to close the second switch 402 and the counts in both registers can be reset to 0. Further, in the M register, the RSSI 408 can keep a count of the number of times that the power value signal 410 is lower than the threshold value T3. When the value of M reaches a predetermined value L, the value of both N and M can be reset to 0, thereby avoiding closing the switch 402 when the power value signal 407 is not consistently higher than the threshold value T3.

With the first switch 401 in the closed position and the second switch 402 in the closed position and amplification being performed on the third 405 LNA but not the first 403 and not the second 404 LNA, the RSSI 408 can receive power value signals 410 from the second power detector 409. In various embodiments, the RSSI 408 can detect when the power value signal 410 is lower than a predetermined threshold T4. In one embodiment, T4 can be the same value as T2; in another embodiment T4 and T2 can be different. If the power value signal 410 is consistently lower than the threshold value T4 for a predefined period of time or for a predefined number of consecutive measurements performed by the power detector 409, then the RSSI 408 can send a signal 411 to open the second switch 402, conveying subsequent signals to the second 404 and third 405 but not the first 403 LNA. In various embodiments, if the power value signal 410 is measured to be higher than T4 for fewer than a predetermined number of measurements and lower than T4 for a different predetermined number of measurements, then the RSSI 408 can send a signal 411 to open the switch 402. In various embodiments, if the average value of the power value signals 410 taken over a predetermined number of measurements is lower than the threshold value T4, then the RSSI 408 can send a signal 411 to open the switch 402. In various embodiments, the RSSI 408 can keep a count of the number of times that the power value signal 410 is lower than the threshold value T4 in the N register. If the value of N reaches a predetermined value N0, then the RSSI 408 can send a signal to open the second switch 402 and the counts in both registers can be reset to 0. Further, in the M register, the RSSI 408 can keep a count of the number of times that the power value signal 410 is higher than the threshold value T4. When the value of M reaches a predetermined value L, the value of both N and M can be reset to 0, thereby avoiding opening the switch 402 when the power value signal 410 is not consistently lower than the threshold value T4.

In various embodiments, the thresholds T3 and T4 can be set so that the second switch 402 is closed for incoming signals that are higher in power than the incoming signals for which the switch is opened, thereby creating an incoming signal power hysteresis that can stabilize the system. Namely, if the RSSI 408 is configured to close the switch when incoming signals are at or above a power value P2, according to a switch closing logic as described above, then the RSSI 408 can be configured to send a signal to open the second switch 402 when the incoming signals are below a power value that is less than P2 by a defined amount. An advantage of the embodiment is that a signal fluctuating in a power range around P2 will not create instability in the system by causing the system to constantly switch between amplification paths.

For example, in an embodiment, the value of T3 can be in the range of −15 dBm to −5 dBm, for instance, −10 dBm. In an embodiment, T4 can be in the range of −35 dBm to −25 dBm, for example, −30 dBm. In an embodiment, N could be a 15 bit register. The value N0 could be a number held in the N register. In an embodiment, M could be a 15 bit register. The value L could be a number held in the M register. In an embodiment, the value L could be determined by applying the identity $L=N0/2^T$ where T is a number held in a three bit register. In an embodiment, T can be selected at the design stage of a device. In another embodiment, a device can incorporate logic and circuitry that can adjust the value of T during operation according to the performance needs of the device.

Figure 5:
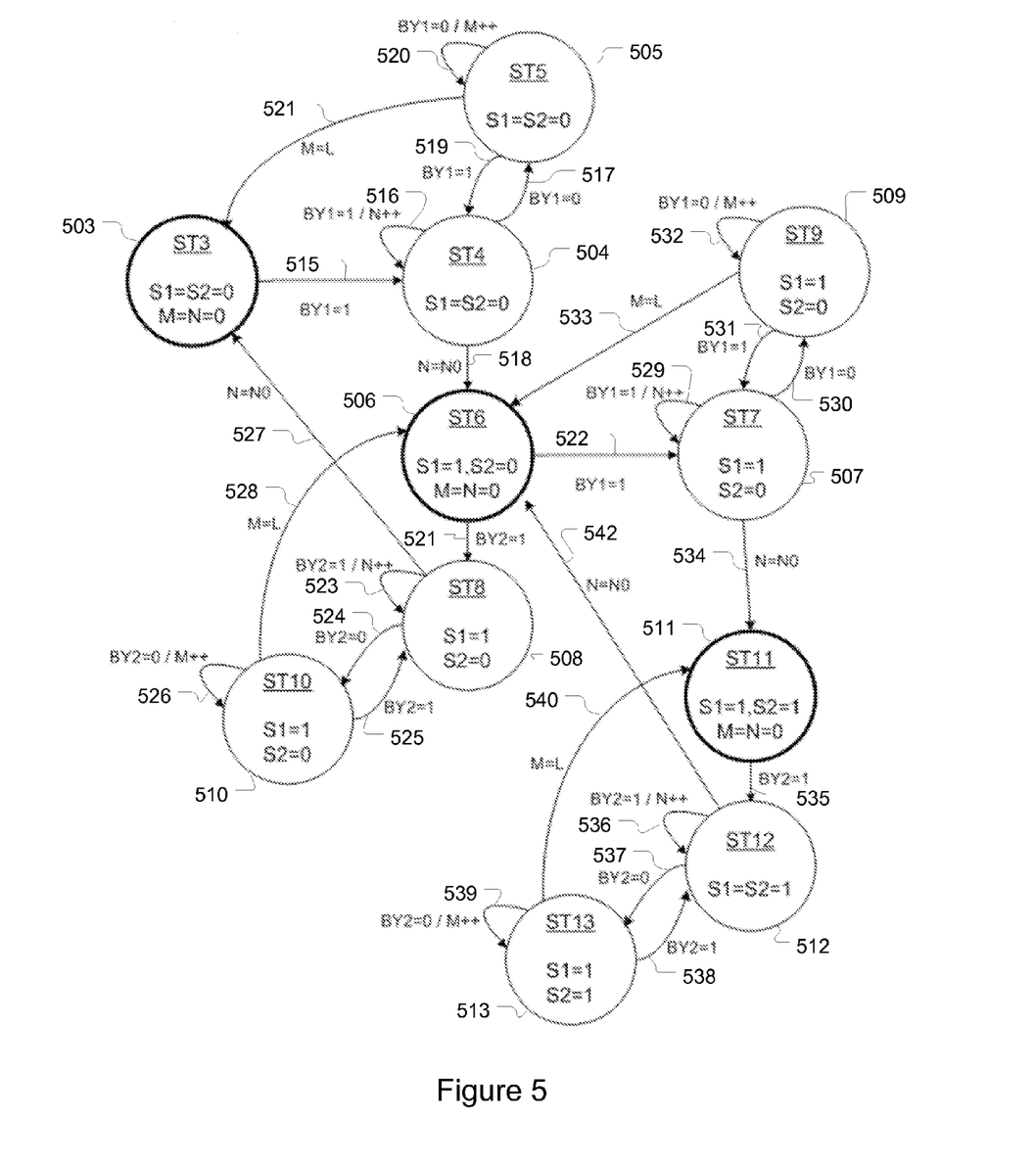
FIG. 5 is an illustration of a state machine representing the logic incorporated into the RSSI in an embodiment of the invention such as the embodiment illustrated in FIG. 4.

FIG. 5 is an illustration of a state machine representing the logic incorporated into the RSSI in an embodiment of the invention such as the embodiment illustrated in FIG. 4. In FIG. 5, each circle represents one of eleven states in the logic incorporated into the RSSI 408, labeled "ST3" through "ST13." S1 can be a signal that the RSSI 408 can send to the first switch 401 to open or close the first switch 401. S2 can be a signal that the RSSI 408 can send to the second switch 402 to open or close the second switch 402. In a given state, S1=0 can indicate the RSSI 408 sending a signal to open the first switch 401 and S1=1 can indicate the RSSI 408 sending a signal to close the first switch 401. Similarly, in a given state, S2=0 can indicate the RSSI 408 sending a signal to open the second switch 402 and S2=1 can indicate the RSSI 408 sending a signal to close the second switch 402. In a given state, M and N can be registers within the RSSI's 408 logic that keep a count of the number of times a signal's power is measured to be above or below a given threshold value, as will be explained in further detail below. When the count in register N reaches a preset limit, N0, the system can move to a different state by opening or closing a switch and resetting the registers M and N to 0. When the count in register M reaches a limit, L, the system can move to a different state by resetting both register N and register M to 0. In various embodiments, BY1 can be a power detection signal conveyed to the RSSI 408 from the first power detector 406, representing the power of a measured signal. BY1=0 can indicate that the measured signal's power is below a predetermined threshold, T1. BY1=1 can indicate that the measured signal's power is above the predetermined threshold, T1. BY2 can be a power detection signal conveyed to the RSSI 408 from the second power detector 409, representing the power of a measured signal. BY2=0 can indicate that the measured signal's power is above a predetermined threshold, T2. BY2=1 can indicate that the measured signal's power is below the predetermined threshold, T2. In various embodiments, the threshold values T1 and T2 can be set so that a switch is closed for incoming signals that are higher in power than the incoming signals for which the switch is opened, thereby creating an incoming signal power hysteresis that can stabilize the system, as described in the preceding paragraphs.

As illustrated in FIG. 5, the system can start operating in state 3 503, where the first switch 401 and the second switch 402 are open (S1=S2=0), and both registers are set to "0"

(M=N=0). If the signal power at the first power detector 406 is measured to be above the predetermined threshold T1, then BY1=1. In state 3 503, if BY1=1, then the system can move to state 4 504, where S1=S2=0, as illustrated by the arrow labeled "BY1=1" 515. In state 4 504, each time BY1=1, the value in the N register can be increase by 1, as indicated by the arrow circling back to state 4, labeled "BY1=1/N++" 516. If the value in the N register reaches the value N0, then the system can move to state 6 506, as illustrated by the arrow labeled "N=N0" 518. In state 6 506, S1=1, S2=0, and M=N=0; hence, the first switch is closed, the second switch is open, and registers N and M are reset to 0. In state 4 504, if the signal power at the first power detector 406 is measured to be below the predetermined threshold T1, then BY1=0. In state 4 504, if BY1=0, then the system can move to state 5 505, where S1=S2=0, as illustrated by the arrow labeled "BY1=0" 517. In state 5 505, each time BY1=0, the value in the M register can be increase by 1, as indicated by the arrow circling back to state 5, labeled "BY1=0/L++" 520. If the value in the M register reaches the value L, then the system can move to state 3 503, as illustrated by the arrow labeled "M=L" 521. In state 5 505, if BY1=1, then the system can move to state 4 504, where S1=S2=0. In state 6 506, if BY1=1, then the system can move to state 7 507, where S1=1 and S2=0, as illustrated by the arrow 522. In state 6 506, if BY2=1, then the system can move to state 8 508, where S1=1 and S2=0, as illustrated by the arrow 521. In state 8 508, each time BY2=1, the value in the N register can be increase by 1, as indicated by the arrow 523. If the value in the N register reaches the value N0, then the system can move to state 3 503, as illustrated by the arrow 527. In state 8 508, if BY2=0, then the system can move to state 10 510, where S1=1 and S2=0, as illustrated by the arrow 524. In state 10 510, if BY2=1, then the system can move to state 8 508, as illustrated by the arrow 525. In state 10 510, each time BY2=0, the value in the M register can be increase by 1, as indicated by the arrow 526. If the value in the M register reaches the value L, then the system can move to state 6 506, as illustrated by the arrow 528. In state 7 507, each time BY1=1, the value in the N register can be increase by 1, as indicated by the arrow 529. If the value in the N register reaches the value N0, then the system can move to state 11 511, where S1=1, S2=2, and M=N=0, as illustrated by the arrow 534. In state 7 507, if BY1=0, then the system can move to state 9 509, where S1=1 and S2=0, as illustrated by the arrow 530. In state 9 509, if BY1=1, then the system can move to state 7 507, as illustrated by the arrow 531. In state 9 509, each time BY1=0, the value in the M register can be increase by 1, as indicated by the arrow 532. If the value in the M register reaches the value L, then the system can move to state 6 506, as illustrated by the arrow 533. In state 11 511, if BY2=1, then the system can move to state 12 512, where S1=S2=1, as illustrated by the arrow 535. In state 12 512, each time BY2=1, the value in the N register can be increase by 1, as indicated by the arrow 536. If the value in the N register reaches the value N0, then the system can move to state 6 506, as illustrated by the arrow 542. In state 12 512, if BY2=0, then the system can move to state 13 513, where S1=1 and S2=1, as illustrated by the arrow 537. In state 13 513, if BY2=1, then the system can move to state 12 512, as illustrated by the arrow 538. In state 13 513, each time BY2=0, the value in the M register can be increase by 1, as indicated by the arrow 539. If the value in the M register reaches the value L, then the system can move to state 11 511, as illustrated by the arrow 540.

While certain exemplary embodiments have been described and shown in the accompanying drawings, it is to be understood that such embodiments are merely illustrative of and not restrictive on the broad invention, and that this invention is not limited to the specific constructions and arrangements shown and described, since various other modifications may occur to those ordinarily skilled in the art. Hence, alternative arrangements and/or quantities of amplifiers, bypass switches, RSSIs, power detectors, and transmission paths can occur without departing from the spirit and scope of the invention. Similarly, components not explicitly mentioned in this specification can be included in various embodiments of this invention without departing from the spirit and scope of the invention. Also, functions and logic described as being performed in certain components in various embodiments of this invention can, as would be apparent to one skilled in the art, be readily performed in whole or in part in different components or in different configurations of components not explicitly mentioned in this specification without departing from the spirit and scope of the invention. Accordingly, the specification and drawings are to be regarded in an illustrative rather than a restrictive sense.

The various embodiments of the invention may also involve a number of functions to be performed by a computer processor, such as a microprocessor. The microprocessor may be a specialized or dedicated microprocessor that is configured to perform particular tasks according to the embodiments by executing machine-readable software code that defines the particular tasks described herein. The microprocessor may also be configured to operate and communicate with other devices such as direct memory access modules, memory storage devices, Internet related hardware, and other devices that relate to the transmission of data in accordance with the embodiments of the invention. The software code may be configured using software formats such as Java, C++, XML (Extensible Mark-up Language) and other languages that may be used to define functions that relate to operations of devices required to carry out the functional operations related to the embodiments of the invention. The code may be written in different forms and styles, many of which are known to those skilled in the art. Different code formats, code configurations, styles, and forms of software programs and other means of configuring code to define the operations of a microprocessor in accordance with the embodiments of the invention will not depart from the spirit and scope of the invention.

Within the different types of devices, such as computers, laptops, cell phones, PDAs, mobile televisions, personal navigation devices, personal media players or other devices that can utilize the embodiments of the invention, there can exist different types of memory components for storing and retrieving information while performing functions according to the embodiments. Cache memory devices can be included in such devices for use by a central processing unit as a convenient storage location for information that is frequently stored and retrieved. Similarly, a persistent memory can be used with such devices for maintaining information that is frequently retrieved by the central processing unit, but that is not often altered within the persistent memory, unlike the cache memory. Main memory can also be included for storing and retrieving larger amounts of information such as data and software applications configured to perform functions according to the various embodiments when executed by the central processing unit. These memory devices may be configured as random access memory (RAM), static random access memory (SRAM), dynamic random access memory (DRAM), flash memory, and other memory storage devices that may be accessed by a central processing unit to store and retrieve information. During data storage and retrieval operations, these memory devices are transformed to have different states, such as different electrical charges, different magnetic polarity, and the like. Thus, systems and methods configured according to the embodiments of the invention as described herein enable the physical transformation of these memory devices. Accordingly, the embodiments described herein are directed to novel and useful systems and methods that, in one or more embodiments, are able to transform the memory device into a different state. The invention is not limited to any particular type of memory device, or any commonly used protocol for storing and retrieving information to and from these memory devices, respectively.

Further, within the different types of devices, such as computers, laptops, cell phones, PDAs, mobile televisions, personal navigation devices, personal media players or other devices that utilize the embodiments of the invention, there can exist different types of interface components for conveying and displaying information while performing functions described herein. Visual displays such as LCDs and monitors, and audio devices such as speakers can be included in such devices to display information contained in a received signal in audio and/or visual format while performing functions of the various embodiments. During operation, these components are transformed into different states to display various graphical images or to vibrate at various frequencies in order to convey images and sounds. Thus, systems and methods configured according to the embodiments described herein can enable the physical transformation of these interface components. Further, systems and methods configured according to the embodiments of the invention can enable the transformation of a machine-readable medium, such as a carrier signal, into a different state, such as an image or a sound wave. Accordingly, the novel and useful systems and methods described herein allow, in one or more embodiments, transformation of the interface components into a different state and transformation of a received signal into a different state. The invention is not limited to any particular type of interface component or received signal, or any commonly used protocol for applying such components and signals.

The term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that causes the machine to perform any one or more of the methodologies of the embodiments of the present invention. The machine-readable medium includes any mechanism that provides (i.e., stores and/or transmits) information in a form readable by a machine (e.g., a computer, mobile TV, PDA, cellular telephone, etc.). For example, a machine-readable medium includes memory (such as described above); magnetic disk storage media; optical storage media; flash memory devices; biological electrical, mechanical systems; electrical, optical, acoustical or other form of propagated signals (e.g., carrier waves, infrared signals, digital signals, etc.). The device or machine-readable medium may include a microelectromechanical system (MEMS), nanotechnology devices, organic, holographic, solid-state memory device and/or a rotating magnetic or optical disk. The device or machine-readable medium may be distributed when partitions of instructions have been separated into different machines, such as across an interconnection of computers or as different virtual machines.

While certain exemplary embodiments have been described and shown in the accompanying drawings, it is to be understood that such embodiments are merely illustrative of and not restrictive on the broad invention, and that this invention is not limited to the specific constructions and arrangements shown and described, since various other modifications may occur to those ordinarily skilled in the art. Accordingly, the specification and drawings are to be regarded in an illustrative rather than a restrictive sense.

Reference in the specification to "an embodiment," "one embodiment," "some embodiments," "various embodiments" or "other embodiments" means that a particular feature, structure, or characteristic described in connection with the embodiments is included in at least some embodiments, but not necessarily all embodiments. References to "an embodiment," "one embodiment," or "some embodiments" are not necessarily all referring to the same embodiments. If the specification states a component, feature, structure, or characteristic "may," "can," "might," or "could" be included, that particular component, feature, structure, or characteristic is not required to be included. If the specification or claim refers to "a" or "an" element, that does not mean there is only one of the element. If the specification or claims refer to an "additional" element, that does not preclude there being more than one of the additional element.

The invention claimed is:

1. A method for amplifying a RF signal in a receiver, the method comprising:
    receiving the RF signal at the receiver;
    amplifying the RF signal on a first amplification path;
    measuring the power of the RF signal to get a power value;
    routing the RF signal to a second amplification path if the power value is higher than a first defined threshold value, wherein the second amplification path produces weaker amplification of the RF signal than the first amplification path;
    measuring the power value of the RF signal when the RF signal is routed to the second amplification path; and
    routing the RF signal to a third amplification path, if the power value is higher than a third defined threshold value, wherein the third amplification path produces weaker amplification of the RF signal than the second amplification path;
    measuring the power value of the RF signal when the RF signal is routed to the third amplification path; and
    routing the RF signal to the second amplification path, if the power value is lower than a fourth defined threshold value.

2. The method of claim 1, wherein routing the RF signal to a second amplification path further includes:
    routing the RF signal from the first amplification path to the second amplification path if the power value is higher than the first defined threshold value for a predetermined number of consecutive measurements; or
    routing the RF signal from the first amplification path to the second amplification path if the average value of the power value over a predetermined number of measurements is higher than the first defined threshold value; or
    routing the RF signal from the first amplification path to the second amplification path if the power value is higher than the first defined threshold value for at least a predetermined number of measurements out of a second predetermined number of total measurements.

3. The method of claim 1, wherein the power value for determining whether the power value is higher than the first defined threshold value is measured in a power detector and the power value for determining whether the power value is lower than the second defined threshold value is measured in another power detector.

4. The method of claim 1, wherein a decision to route between the first amplification path and the second amplification path is made based on at least the power value according to logical code incorporated in a digital received signal strength indicator (RSSI) unit.

5. The method of claim 1, further comprising:
measuring the power value of the RF signal when the RF signal is routed to the second amplification path; and
routing the RF signal to the first amplification path if the power value is lower than a second defined threshold value.

6. The method of claim 5, wherein routing the RF signal to the first amplification path further includes:
routing the RF signal from the second amplification path to the first amplification path if the power value is lower than the second defined threshold value for a predetermined number of consecutive measurements; or
routing the RF signal from the second amplification path to the first amplification path if the average value of the power value over a predetermined number of measurements is lower than the second defined threshold value; or
routing the RF signal from the second amplification path to the first amplification path if the power value is lower than the second defined threshold value for at least a predetermined number of measurements out of a second predetermined number of total measurements.

7. The method of claim 5, wherein routing from the first amplification path to the second amplification path is performed for incoming RF signals of higher power than the incoming RF signals for which routing from the second amplification path to the first amplification path is performed, thereby creating an incoming signal power hysteresis.

8. A method for amplifying a RF signal in a receiver, the method comprising:
receiving the RF signal at the receiver;
amplifying the RF signal on a first amplification path;
measuring the power of the RF signal to get a power value;
routing the RF signal to a second amplification path if the power value is higher than a first defined threshold value, wherein the second amplification path produces weaker amplification of the RF signal than the first amplification path;
measuring the power value of the RF signal when the RF signal is routed to the second amplification path;
routing the RF signal to the first amplification path if the power value is lower than a second defined threshold value;
maintaining a first register and a second register, both initially set to 0, within a portion of the receiver capable of executing logical code;
increasing the value in the first register by 1 each time that the power value is measured above the first threshold when amplification is being performed on the first amplification path;
increasing the value in the second register by 1 each time the power value is measured below the first threshold when amplification is being performed on the first amplification path;
routing the RF signal to the second path and resetting the first register to 0 and the second register to 0 if the value in the first register equals a first predefined value when amplification is being performed on the first amplification path;
resetting the first register to 0 and the second register to 0 if the value in the second register equals a second predefined value when amplification is being performed on the first amplification path;
increasing the value in the first register by 1 each time that the power value is measured below the second threshold when amplification is being performed on the second amplification path;
increasing the value in the second register by 1 each time that the power value is measured above the second threshold when amplification is being performed on the second amplification path;
routing the RF signal to the first path and resetting the first register to 0 and the second register to 0 if the value in the first register equals a predefined value when amplification is being performed on the second amplification path;
resetting the first register to 0 and the second register to 0 if the value in the second register equals a predefined value when amplification is being performed on the second amplification path.

9. An apparatus for amplifying a RF signal in a receiver, comprising:
a first amplification path;
a second amplification path which second amplification path produces less amplification than the first amplification path;
one or more power detectors that measure the power of the RF signal to obtain a power value;
a bypass switch for routing the RF signal to either the first amplification path or the second amplification path; and
a received signal strength indicator (RSSI) unit connected to the bypass switch that receives the power value from the power detector, which RSSI unit routes the RF signal from the first amplification path to the second amplification path if the power value is higher than a first defined threshold value by manipulating the bypass switch according to logical code incorporated into the RSSI;
a third amplification path that produces weaker amplification of the RF signal than the second amplification path;
wherein the RSSI unit routes the RF signal to the third amplification path if the power value is higher than a third defined threshold value when the RF signal is being amplified on the second amplification path;
wherein the RSSI unit routes the RF signal to the second amplification path, if the power value is lower than a fourth defined threshold value when the RF signal is being amplified on the third amplification path.

10. The apparatus of claim 9, wherein the RSSI unit performs at least one of:
routing the RF signal from the first amplification path to the second amplification path if the power value is higher than the first defined threshold value for a predefined number of consecutive measurements; or
routing the RF signal from the first amplification path to the second amplification path if the average value of the power value over a predetermined number of measurements is higher than the first defined threshold value; or
routing the RF signal from the first amplification path to the second amplification path if the power value is higher than the first defined threshold value for at least a predetermined number of measurements out of a second predetermined number of total measurements.

11. The apparatus of claim 9, wherein one power detector measures the power value for determining whether the power value is higher than the first defined threshold value and another power detector measures the power value for determining whether the power value is lower than the second defined threshold value.

12. The apparatus of claim 9, wherein one power detector measures the power value for determining whether the power value is higher than the first defined threshold value and/or for determining whether the power value is higher than the third defined threshold value and another power detector measures the power value for determining whether the power value is lower than the second defined threshold value and/or for determining whether the power value is lower than the fourth defined threshold value.

13. The method of claim 9, wherein the RSSI unit routes the RF signal from the second amplification path to the first amplification path if the power value is lower than a second defined threshold value when the RF signal is being amplified on the second amplification path.

14. The method of claim 13, wherein the RSSI unit performs at least one of:
routing the RF signal from the second amplification path to the first amplification path if the power value is lower than the second defined threshold value for a predefined number of consecutive measurements; or
routing the RF signal from the second amplification path to the first amplification path if the average value of the power value over a predetermined number of measurements is lower than the second defined threshold value; or
routing the RF signal from the second amplification path to the first amplification path if the power value is lower than the second defined threshold value for at least a predetermined number of measurements out of a second predetermined number of total measurements.

15. The method of claim 13, wherein the RSSI unit routes the RF signal from the first amplification path to the second amplification path for incoming RF signals of higher power than the incoming RF signals for which the RSSI unit routes the RF signal from the second amplification path to the first amplification path, thereby creating an incoming signal power hysteresis.

16. An apparatus for amplifying a RF signal in a receiver, comprising:
a first amplification path;
a second amplification path, which second amplification path produces less amplification than the first amplification path;
one or more power detectors that measure the power of the RF signal to obtain a power value;
a bypass switch for routing the RF signal to either the first amplification path or the second amplification path; and
a received signal strength indicator (RSSI) unit connected to the bypass switch that receives the power value from the power detector, which RSSI unit routes the RF signal from the first amplification path to the second amplification path if the power value is higher than a first defined threshold value by manipulating the bypass switch according to logical code incorporated into the RSSI;
wherein the RSSI unit routes the RF signal to the first amplification path if the power value is lower than a second defined threshold value when the RF signal is being amplified on the second amplification path;
a first register and a second register, both initially set to 0, within a portion of the receiver capable of executing logical code; where
the value in the first register is increased by 1 each time that the power value is measured above the first threshold when amplification is being performed on the first amplification path;
the value in the second register is increased by 1 each time the power value is measured below the first threshold when amplification is being performed on the first amplification path;
the RSSI routes the RF signal to the second path and the first register is reset to 0 and the second register is reset to 0 if the value in the first register equals a first predefined value when amplification is being performed on the first amplification path;
the first register is reset to 0 and the second register is reset to 0 if the value in the second register equals a second predefined value when amplification is being performed on the first amplification path;
the value in the first register is increased by 1 each time that the power value is measured below the second threshold when amplification is being performed on the second amplification path;
the value in the second register is increased by 1 each time that the power value is measured above the second threshold when amplification is being performed on the second amplification path;
the RSSI routes the RF signal to the first path and the first register is reset to 0 and the second register is reset to 0 if the value in the first register equals a predefined value when amplification is being performed on the second amplification path; and
the first register is reset to 0 and the second register is reset to 0 if the value in the second register equals a predefined value when amplification is being performed on the second amplification path.

* * * * *